US010075161B2

(12) United States Patent
Shu

(10) Patent No.: US 10,075,161 B2
(45) Date of Patent: Sep. 11, 2018

(54) METHOD AND DEVICE FOR PREVENTING INADVERTENTLY TOUCH OF ELECTRONIC DEVICE

(71) Applicant: Wistron Corporation, New Taipei (TW)

(72) Inventor: Chia-Jen Shu, New Taipei (TW)

(73) Assignee: Wistron Corporation, New Taipei (TW)

( * ) Notice: Subject to any disclaimer, the term of this patent is extended or adjusted under 35 U.S.C. 154(b) by 991 days.

(21) Appl. No.: 14/151,829

(22) Filed: Jan. 10, 2014

(65) Prior Publication Data

US 2015/0084436 A1    Mar. 26, 2015

(30) Foreign Application Priority Data

Sep. 26, 2013  (TW) .............................. 102134828 A

(51) Int. Cl.
*H03K 17/955* (2006.01)
*H03K 17/96* (2006.01)

(52) U.S. Cl.
CPC ......... *H03K 17/955* (2013.01); *H03K 17/962* (2013.01); *H01H 2239/03* (2013.01); *H01H 2239/07* (2013.01); *H03K 2217/94036* (2013.01); *H03K 2217/96058* (2013.01); *H03K 2217/960705* (2013.01); *Y10T 307/826* (2015.04)

(58) Field of Classification Search
CPC .............. H03K 17/955; H03K 17/962; H03K 2217/960705; H03K 2217/94036; H03K 2217/96058; H01H 2239/07; H01H 2239/03
See application file for complete search history.

(56) References Cited

U.S. PATENT DOCUMENTS

| 6,374,145 B1 | 4/2002 | Lignoul |
| 6,680,677 B1 | 1/2004 | Tiphane |
| 7,755,219 B2 * | 7/2010 | Bruwer .............. H05B 37/0227 307/116 |

(Continued)

FOREIGN PATENT DOCUMENTS

| CN | 101183277 | 5/2008 |
| CN | 102957767 | 3/2013 |

(Continued)

OTHER PUBLICATIONS

"Office Action of Taiwan Counterpart Application," dated Feb. 13, 2015, with English translation thereof, p. 1-p. 11, in which the listed references were cited.

(Continued)

*Primary Examiner* — Jared Fureman
*Assistant Examiner* — Emmanuel R Dominique
(74) *Attorney, Agent, or Firm* — JCIPRNET

(57) ABSTRACT

A method and a device for preventing inadvertently touch of an electronic device are provided, the method includes: receiving an operating motion by a button switch; determining whether the button switch is triggered by receiving the operating motion; determining whether a human body is closing to the button switch; if the human body is closing to the button switch and the button switch is triggered, sending a button switch signal corresponding to the button switch to the electronic device to perform a function corresponding to the button switch.

14 Claims, 3 Drawing Sheets

(56) References Cited

U.S. PATENT DOCUMENTS

| | | | |
|---|---|---|---|
| 2002/0110373 A1 | 8/2002 | Engle et al. | |
| 2003/0115695 A1* | 6/2003 | Lev | A61C 17/22 15/22.1 |
| 2006/0250377 A1* | 11/2006 | Zadesky | G06F 1/1613 345/173 |
| 2008/0006762 A1* | 1/2008 | Fadell | G01J 1/4204 250/201.1 |
| 2008/0168290 A1 | 7/2008 | Jobs et al. | |
| 2009/0091371 A1* | 4/2009 | Bruwer | H05B 37/0227 327/398 |
| 2009/0197615 A1* | 8/2009 | Kim | H04M 1/605 455/456.1 |
| 2011/0034219 A1* | 2/2011 | Filson | H04M 1/0202 455/575.1 |
| 2011/0279409 A1* | 11/2011 | Salaverry | G06F 3/0416 345/174 |
| 2012/0092270 A1* | 4/2012 | Lyon | G06F 3/03547 345/173 |
| 2012/0172085 A1 | 7/2012 | Vuppu et al. | |
| 2012/0214422 A1* | 8/2012 | Shi | H04B 1/3838 455/67.11 |
| 2013/0207925 A1* | 8/2013 | Ryshtun | G06F 3/0416 345/174 |
| 2013/0214166 A1 | 8/2013 | Barlow et al. | |
| 2013/0314109 A1* | 11/2013 | Kremin | G01R 27/2605 324/686 |

FOREIGN PATENT DOCUMENTS

| | | |
|---|---|---|
| TW | 201337305 | 9/2013 |
| TW | 201337663 | 9/2013 |

OTHER PUBLICATIONS

"Office Action of China Counterpart Application," dated Feb. 28, 2017, with English translation thereof, p. 1-p. 14, in which the listed references were cited.

* cited by examiner

METHOD AND DEVICE FOR PREVENTING INADVERTENTLY TOUCH OF ELECTRONIC DEVICE

CROSS-REFERENCE TO RELATED APPLICATION

This application claims the priority benefit of Taiwan application serial no. 102134828, filed on Sep. 26, 2013. The entirety of the above-mentioned patent application is hereby incorporated by reference herein and made a part of this specification.

BACKGROUND OF THE INVENTION

Field of the Invention

The invention relates to a method and a device for preventing inadvertently touch, and more particularly, to a method and a device for preventing inadvertently touch of an electronic device invented for preventing an electronic device having physical button switch from being unintentionally and inadvertently touched by a user.

Description of Related Art

Generally, as to facilitate users in operations, hand-held electronic devices (such as a MP3 music player, a smart phone or a tablet computer) are disposed with one or more physical buttons slightly extruded from a main body of the electronic devices, so that the users may press the physical buttons to perform related functions. Further, devices including a smart phone and a tablet computer adopt a touch screen that provides virtual buttons on the touch screen for the users to select by using a finger or a stylus, so as to reduce a number of physical buttons being used. However, at least one of the physical buttons is still provided to facilitate in performing power-on and power-off, and entering to or releasing from a screen lock status, or even rapidly activating a specific program or a hardware control function. With the electronic device such as the cell phone gets smaller in size, people are used to place the electronic device in a handbag, a backpack or a coat pocket when they go out.

However, when the user is walking or traveling, the button on the electronic device placed in the handbag, the backpack or the coat pocket may be touched by other objects such as a book or a wallet, such that an unwanted operation may be induced by the electronic device due to the button being accidentally triggered. For instance, in case a power button of the electronic device is inadvertently touched, circumstances including turning on the electronic device, or wakening from a standby/hibernate mode to enter a normal mode, or activating specific software or hardware operative functions and so on, all of which often cause troubles to the user.

SUMMARY OF THE INVENTION

Accordingly, a method and a device for preventing inadvertently touch of an electronic device are provided in the invention, in which a transmission for a button switch signal of a button switch is activated only when a human body is closing to the button switch, such that an unwanted operation executed by the electronic device due to the button switch being inadvertently touched can be effectively prevented.

A method for preventing inadvertently touch of an electronic device is provided, the electronic device has a button switch, and the method includes: determining whether the button switch is triggered by receiving the operating motion; determining whether a first human body is closing to the button switch; if the first human body is closing to the button switch and the button switch is triggered, sending a button switch signal corresponding to the button switch to the electronic device to perform a function corresponding to the button switch.

A device for preventing inadvertently touch of an electronic device is provided, the device has a button switch and a sensing module. The button switch is configured to receive an operating motion and to be triggered by the operating motion. The sensing module is coupled to the button switch, and configured to determine whether a first human body is closing to the button switch. If the first human body is closing to the button switch and the button switch is triggered by the operating motion, the sensing module sends a button switch signal corresponding to the button switch to the electronic device to perform a function corresponding to the button switch.

Based on above, the method and the device for preventing inadvertently touch of the electronic device provided in the invention are capable of synchronously determining whether the human body is closing to the button switch and determining whether the button switch is pressed. The button switch signal is sent to the processor of the electronic device only when the human body is closing to the button switch and the button switch is pressed. Accordingly, the circumstance in which the button switch is inadvertently touched by objects other than human body may be effectively reduced.

To make the above features and advantages of the disclosure more comprehensible, several embodiments accompanied with drawings are described in detail as follows.

DESCRIPTION OF THE EMBODIMENTS

In order to reduce a possibility of a physical button switch being inadvertently touched, a method for preventing inadvertently touch of an electronic device is provided according to the embodiments of the invention, which is capable of sensing whether a human body is closing to a button switch, and generating a button switch signal only when double conditions in which the human body is closing to the button switch and the button switch is indeed pressed are met. Accordingly, a problem of the physical button switch being inadvertently touched in conditions unexpected by the user may be solved. In addition, the embodiments of the invention further disclose an electronic device capable of implementing said method for preventing inadvertently touch. In order to make the invention more comprehensible, embodiments are described below as the examples to prove that the invention can actually be realized.

Figure 1:
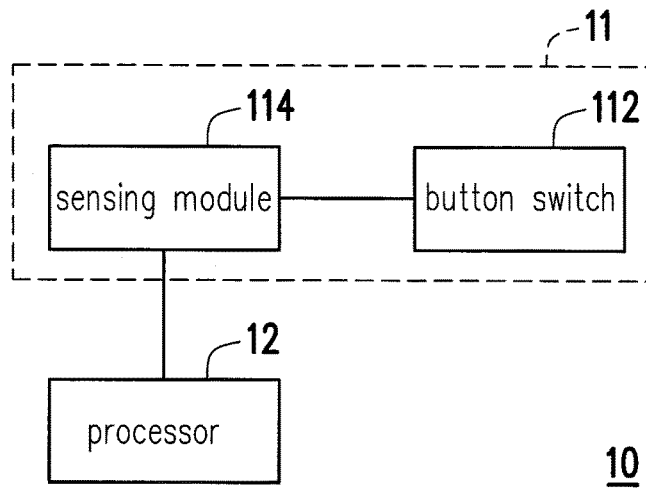
FIG. 1 illustrates an electronic device according to an embodiment of the invention.

FIG. 1 illustrates an electronic device according to an embodiment of the invention. Referring to FIG. 1, an electronic device 10 includes a button switch signal generator 11 and a processor 12. The electronic device 10 may preferably be various electronic devices disposed with the physical button switch, such as hand-held electronic devices including a MP3 music player, a cell phone, a personal digital assistant (PDA), a smart phone, an electronic book, a game console, a tablet PC, a notebook PC, or even a desktop PC, an elevator or a control dashboard of an electronic machine, but the invention is not limited thereto.

The button switch signal generator 11 includes a button switch 112 and a sensing module 114. The button switch 112 is a physical button switch including a button linked to a switch or a button integrally formed with a switch, and configured to receive an operating motion from a user and to be triggered to generate a button switch signal, and the operating motion is, for example, touching or pressing. In the present embodiment, the button switch 112 is, for example, various functional button switches such as a power, a camera or a volume control switches of the electronic device 10, and the invention is not limited thereto.

The sensing module 114 is coupled to the button switch 112 and configured to sense a human body parameter. For instance, the sensing module 114 may sense the human body parameter such as a capacitance, a resistance or a temperature of a capacity effect generated by a human body, and determine whether the human body is existed nearby according to the human body parameter. For instance, when the sensing module 114 senses that the human body parameter falls within a preset parameter range, the sensing module 114 may determine that the human body is closing or the human is existed nearby. A sensing capability of the sensing module 114 is related to a disposing position thereof, and the disposing position may be adjusted according to actual requirements. For instance, in case the sensing module 114 is used to sense the human body closing to the button switch 112, the sensing module 114 or an element substantially having the sensing capability in the sensing module 114 (e.g., a sensing antenna) may be disposed adjacent to the button switch 112, so as to improve an accuracy of a sensing result.

The processor 12 is coupled to the sensing module 114, and the processor 12 may be, for example, a micro-processor, an embedded controller or a central processing unit (CPU), but the invention is not limited thereto.

Figure 2:
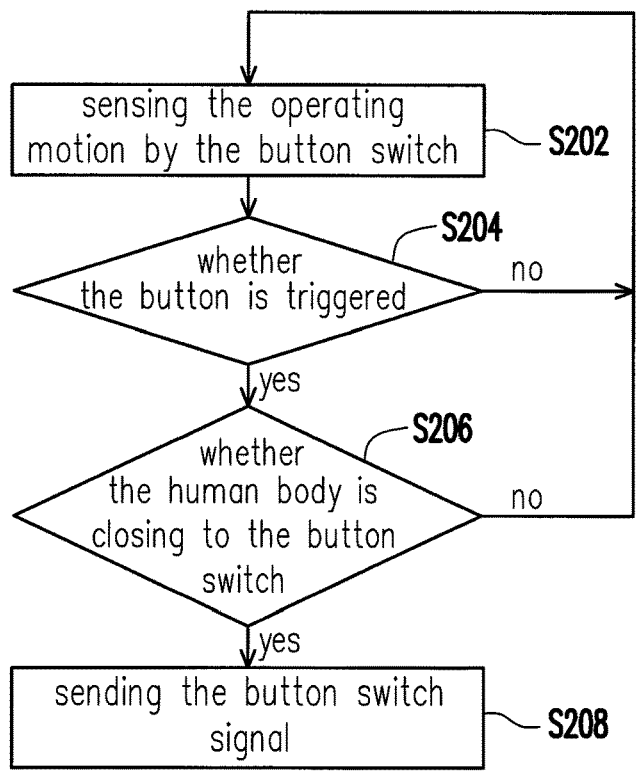
FIG. 2 is a flowchart of a method for generating button switch signal according to an embodiment of the invention.

FIG. 2 is a flowchart of a method for generating button switch signal according to an embodiment of the invention. Detailed descriptions of the method for generating the button switch signal and the button switch signal generator 11 in the embodiments of the invention are described below with reference to FIG. 1 and FIG. 2.

In step S202, the button switch 112 receives the operating motion. Next, in step S204, the sensing module 114 determines whether the button switch 112 is triggered by the operating motion to generate the button switch signal. If not, step S202 is repeatedly performed after step S204. If the button switch 112 is triggered by the operating motion to generate the button switch signal, the sensing module 114 continued to determine whether the human body is closing to the button switch 112 in step S206.

For instance, the sensing module 114 may sense the human body within a range, and generates a sensing value according to the human body being sensed. Said range covers a surface of the button switch 112. Afterwards, the sensing module 114 may determine whether the sensing value is greater than a threshold value. If the sensing value is greater than the threshold value, the sensing module 114 may determine that the human body is closing to the button switch 112.

If the sensing module 114 determines that the human body is closing to the button switch 112, (e.g., the button switch 112 being pressed by a finger), in step S208, the sensing module 114 sends the button switch signal corresponding to the button switch 112 to the processor 12. Furthermore, in step S208, the processor 12 receives the button switch signal from the sensing module 114 and performs subsequent operations corresponding to the button switch 112 being pressed according to the button switch signal. For instance, in case the button switch 112 is a power button switch on the electronic device 10, according to the button switch signal, the processor 12 may turn on a screen of the electronic device 10 or control the electronic device 10 to enter a standby mode. Or, in case the button switch 112 is the camera or the volume control functional button switches on the electronic device 10, the processor 12 may turn on a photographic function of the electronic device 10 or perform a functional operation of the volume control according to the button switch signal, but the invention is not limited thereto. Otherwise, if the sensing module 114 determines that the human body is not closing to the button switch 112, step S202 is repeatedly performed after step S206.

In other words, the sensing module 114 sends the button switch signal to the processor 12 only if the sensing module 114 determines that the human body is closing to the button switch 112 and the button switch 112 is triggered by the operating motion to generate the button switch signal. Otherwise, the sensing module 114 does not send the button switch signal to the processor 12 if the sensing module 114 determines that the human body is not closing to the button switch 112 and/or the button switch 112 is not triggered by the operating motion to generate the button switch signal. Accordingly, a possibility of an unwanted operation performed by the electronic device due to the button switch being inadvertently touched by non-human objects may be substantially reduced.

It should be noted that, a performing sequence of step S204 and step S206 is not limited in the invention. For instance, in an embodiment, step S206 may be performed first, and step S204 is performed only after it is determined that the human body is closing to the button switch 112.

Figure 3:
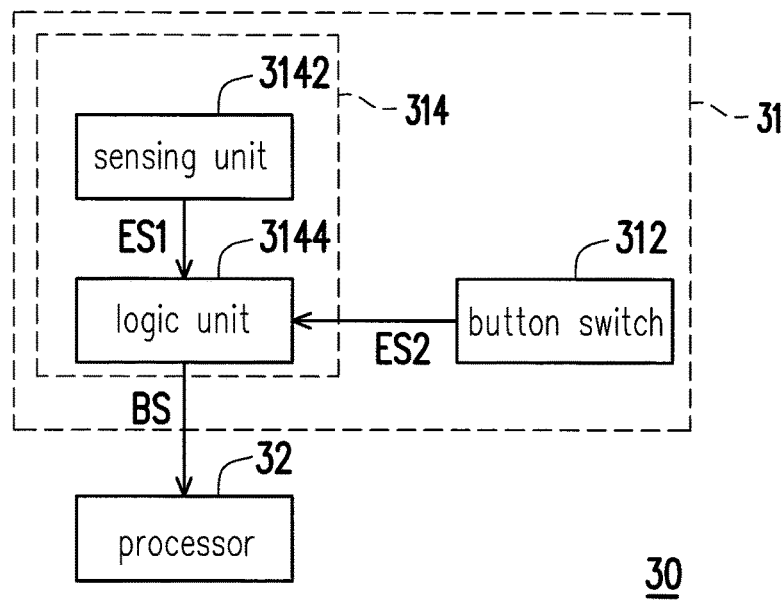
FIG. 3 is a schematic diagram illustrating an electronic device according another embodiment of the invention.

More specifically, FIG. 3 is a schematic diagram illustrating an electronic device according another embodiment of the invention. Referring to FIG. 3, an electronic device 30 includes a button switch signal generator 31 and a processor 32, and the button switch signal generator 31 includes a button switch 312 and a sensing module 314. Therein, the button switch 312 is similar to the button switch 112, and the processor 32 is similar to the processor 12, thus related descriptions are omitted hereinafter.

The sensing module 314 includes a sensing unit 3142 and a logic unit 3144. The sensing unit 3142 is configured to sense and determine whether the human body is closing to the button switch 312. In the present embodiment, the sensing unit 3142 may be a proximity sensor, and a proximity sensing antenna of the proximity sensor is disposed adjacent to the button switch 312.

Figure 4:
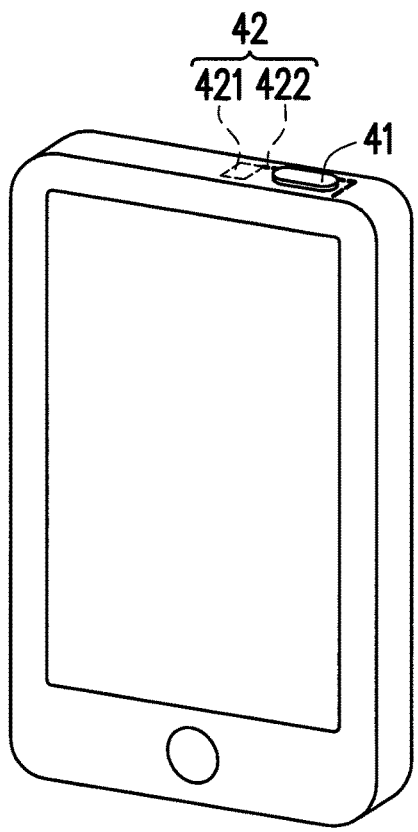
FIG. 4 is a schematic diagram illustrating a sensing unit according an embodiment of the invention.

For instance, FIG. 4 is a schematic diagram illustrating a sensing unit according an embodiment of the invention. Referring to FIG. 4, an electronic device 40 includes a button switch 41, and the electronic device 40 includes a sensing module 42. In the present embodiment, the sensing module 42 includes a proximity sensor 421 and a proximity sensing antenna 422. The proximity sensing antenna 422 may be disposed adjacent to or surrounding the button switch 41, or even disposed on the button switch 41, so that a sensing range of the proximity sensing antenna 422 at least covers a surface of the button switch 41. When a capacitance of a capacity effect generated by the human body (e.g., the finger) is sensed by the proximity sensing antenna 422, the proximity sensing antenna 422 converts the capacitance being sensed into a sensing value. Afterwards, the proximity sensor 421 may determine whether the sensing value is greater than a threshold value. If the sensing value is greater than the threshold value, it indicates that the human body is closing to the button switch 41. In addition, the sensing unit 3142 may also be a proximity sensor which is disposed at a specific position (e.g., near a speaker) of the electronic device, and configured to sense whether the human body is closing to the touch screen during an incoming call or a conversation to determine whether to turn off a screen display or even disable a touch function; or a proximity sensor which is disposed at a specific position (e.g., near a communication antenna) of the electronic device, and configured to sense whether the human body is closing during the conversation to determine whether to perform a communication power adjustment so that the SAR (Specific Absorption Rate) is reduced to below average. Accordingly, costs in disposing additional proximity sensors may be reduced.

Further, in other embodiments, the sensing unit 3142 may also be a sensing material layer attached to the surface of the button switch.

Figure 5:
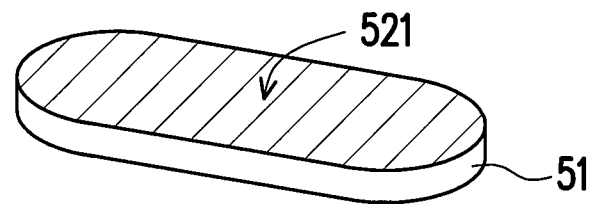
FIG. 5 is a schematic diagram illustrating a sensing unit according another embodiment of the invention.

For instance, FIG. 5 is a schematic diagram illustrating a sensing unit according an embodiment of the invention. Referring to FIG. 5, a sensing module (e.g., a sensing module 314) includes a sensing material layer 521 and the sensing material layer 521 is disposed on a surface of a button switch 51. When the user approaches or touches the sensing material layer 521, the sensing material layer 521 may convert a capacitance of a capacity effect generated by the human body into a sensing value. If the sensing value is greater than the threshold value, it indicates that the human body is closing to the surface of the button switch 51.

Referring back to FIG. 3, when the human body is closing to the button switch 312, the sensing unit 3142 may generate a first enable signal ES1. If the button switch 312 is triggered by receiving the operating motion, the button switch 312 may generate a second enable signal ES2. Thereafter, the logic unit 3144 may generate a button switch signal BS according to the first enable signal ES1 and the second enable signal ES2, and send the button switch signal BS to the processor 32. In the present embodiment, the logic unit 3144 may include an AND gate. For instance, when the first enable signal ES1 is "1" and the second enable signal ES2 is also "1", the logic unit 3144 may send the button switch signal BS to the processor 32, the processor 32 may perform subsequent operations according to the button switch signal BS. On the contrary, when either one of the first enable signal ES1 and the second enable signal ES2 is not "1", the logic unit 3144 does not send the button switch signal BS to the processor 32. Next, the processor 32 may perform subsequent operations corresponding to the button switch 312 being pressed according to the button switch signal BS.

However, the invention is not limited to above embodiments. In an embodiment, besides sensing the human body closing to the button switch of the electronic device, the sensing module may also sense whether the human body is also closing to specific positions of the electronic device (e.g., near the speaker or the communication antenna), so that an ON/OFF state, or an enable state, or reducing of the communication power for the touch screen of the electronic device may be controlled according to the sensing result.

Figure 6:
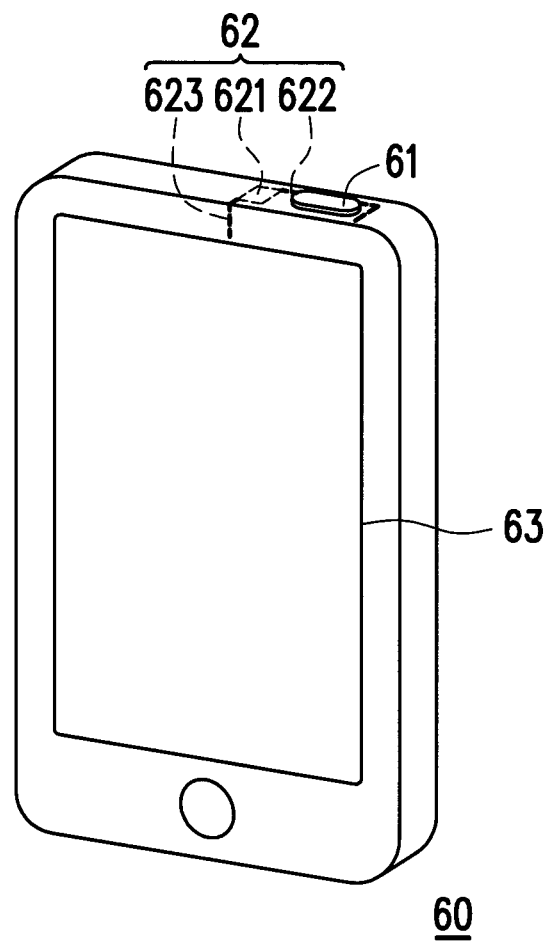
FIG. 6 is a schematic diagram illustrating an electronic device according another embodiment of the invention.

For instance, FIG. 6 is a schematic diagram illustrating an electronic device according another embodiment of the invention. Referring to FIG. 6, an electronic device 60 includes a button switch 61, and the electronic device 60 includes a sensing module 62. The sensing module 62 includes a proximity sensor 621, a first proximity sensing antenna 622 and a second proximity sensing antenna 623. The first proximity sensing antenna 622 is disposed adjacent to the button switch 61, and the second proximity sensing antenna 623 is extended above a touch screen 63 of the electronic device 60 and near the positions of the speaker or the communication antenna. Therein, a sensing range of the first proximity sensing antenna 622 covers a surface of the button switch 61, and a sensing range of the second proximity sensing antenna 623 at least covers an upper half of the electronic device 60.

When a capacitance of a capacity effect generated by the human body (e.g., the finger) is sensed by the first proximity sensing antenna 622, the first proximity sensing antenna 622 converts the capacitance being sensed into a first sensing value. Afterwards, the proximity sensor 621 may determine whether the first sensing value is greater than a first threshold value. If the first sensing value is greater than the first threshold value, it indicates that the human body is closing to the button switch 61. In addition, when the capacitance of the capacity effect generated by the human body is also sensed by the second proximity sensing antenna 623, the second proximity sensing antenna 623 converts the capacitance being sensed into a second sensing value. Afterwards, the proximity sensor 621 may determine whether the second sensing value is greater than a second threshold value. If the second sensing value is greater than the second threshold value, it indicates that the human body is closing to the touch screen 63.

Thereafter, the sensing unit 62 may output a corresponding signal to a processor (e.g., the processor 12 depicted in FIG. 1) of the electronic device 60 according to a sensing result of the proximity sensor 621. For instance, when the sensing result of the proximity sensor 621 indicates that the human body is closing to the button switch 61 and the human body is closing to the touch screen 63, the sensing module 62 may send a touch screen turn-off signal to the processor (e.g., the processor 12 depicted in FIG. 1) of the electronic device 60 to turn off a screen display of the touch screen 63 (e.g., a frame is not outputted by an image process unit and/or a backlight module is turned off); and/or send a touch function disable signal to the processor of the electronic device 60 to disable a touch function of the touch screen 63. In addition, when the button switch 61 is triggered by the operating motion for the button switch 61, the sensing module 62 sends the button switch signal to the processor (e.g., the processor 12 depicted in FIG. 1) of the electronic device 60, so that the processor (e.g., the processor 12 depicted in FIG. 1) of the electronic device 60 is granted to perform subsequent operations corresponding to the button switch 61 being pressed.

It should be note that, depended on the actual requirements, the touch screen turn-off signal, the touch function disable signal and the button switch signal may be signals independent from each other, or an integrated signal integrally outputted by the sensing module. For instance, the processor (e.g., the processor 12 depicted in FIG. 1) of the electronic device 60 may turn off the touch screen 63, turn off the touch screen 63, disable the touch function of the touch screen 63 and perform subsequent operations corresponding to the button switch 61 being pressed according to the integrated signal having the screen turn-off signal, the touch function disable signal and the button switch signal.

Based on above, the method and the device for preventing inadvertently touch of the electronic device provided in the embodiments of the invention are capable of synchronously determining whether the human body is closing to the button switch and determining whether the button switch is triggered after being pressed. The button switch signal is granted to be sent to the processor of the electronic device only when the human body is closing to the button switch and the button switch is triggered after being pressed. Accordingly, the circumstance in which the button switch is inadvertently touched by objects other than human body may be effectively reduced. In addition, the invention may also be integrated to a screen switching mechanism during a conversation, so to provide a high usability in practical uses.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for preventing inadvertently touch of an electronic device, the electronic device having a physical button switch, and the method comprising:
   determining whether the physical button switch is triggered by an operation motion being received;
   determining whether a first human body is closing to the physical button switch;
   if the first human body is closing to the physical button switch and the physical button switch is triggered, sending a physical button switch signal corresponding to the physical button switch to the electronic device to perform a function corresponding to the physical button switch; and
   if the first human body is not closing to the physical button switch when the physical button switch is triggered, not sending, by a sensing module, the physical button switch signal corresponding to the physical button switch to the electronic device,
   wherein the electronic device comprises the sensing module, and the step of determining whether the first human body is closing to the physical button switch comprises:
      sensing whether the first human body is entering a first range by the sensing module, and generating a first sensing value in response to that the first human body entering the first range is sensed, wherein the first range is a spatial range which covers a physical surface of the physical button switch, wherein the first sensing value is indicative of the closeness of the first human body to the physical button switch; and
      determining that the first human body is closing to the physical button switch if the first sensing value is greater than a first threshold value.

2. The method for preventing inadvertently touch of the electronic device of claim 1, further comprising:
   if the physical button switch is not triggered by the operation motion, not sending, by the sensing module, the physical button switch signal corresponding to the physical button switch to the electronic device.

3. The method for preventing inadvertently touch of the electronic device of claim 1, wherein the sensing module comprises a sensing unit and a logic unit, and if the first human body is closing to the physical button switch and the physical button switch is triggered, sending the physical button switch signal corresponding to the physical button switch to the electronic device comprises:
   generating a first enable signal by the sensing unit;
   generating a second enable signal by the physical button switch; and
   generating the physical button switch signal according to the first enable signal and the second enable signal by the logic unit, and sending the physical button switch signal to the electronic device.

4. The method for preventing inadvertently touch of the electronic device of claim 3, wherein the logic unit comprises an AND gate.

5. The method for preventing inadvertently touch of the electronic device of claim 1, wherein the electronic device comprises a touch screen, and the method further comprises:
   sensing whether a second human body is entering a second range by the sensing module, and generating a second sensing value in response to that the second human body entering the second range is sensed, wherein the second range is another spatial range which at least covers a physical part of the electronic device, wherein the second sensing value is indicative of the closeness of the second human body to the physical part of the electronic device; and
   if the second sensing value is greater than a second threshold value, sending a screen turn-off signal and/or a touch function disable signal to the electronic device to turn off a screen display of the touch screen and/or to disable a touch function.

6. The method for preventing inadvertently touch of the electronic device of claim 1, wherein the sensing module comprises a proximity sensor, and a proximity sensing antenna of the proximity sensor is disposed adjacent to the physical button switch.

7. The method for preventing inadvertently touch of the electronic device of claim 1, wherein the sensing module comprises a sensing material layer, and the sensing material layer is disposed on the physical surface of the physical button switch.

8. A device for preventing inadvertently touch of the electronic device, comprising:
   a physical button switch configured to receive an operating motion and to be triggered by the operating motion; and
   a sensing module coupled to the physical button switch, and configured to determine whether a first human body is closing to the physical button switch,
   wherein if the first human body is closing to the physical button switch and the physical button switch is triggered by the operating motion, the sensing module sends a physical button switch signal corresponding to the physical button switch to the electronic device to perform a function corresponding to the physical button switch,
   wherein if the first human body is not closing to the physical button switch when the physical button switch is triggered, the sensing module does not send the physical button switch signal corresponding to the physical button switch to the electronic device,
   wherein the sensing module senses whether the first human body is entering a first range, and generates a first sensing value in response to that the first human body entering the first range is sensed, wherein the first range is a spatial range which covers a physical surface of the physical button switch, wherein the first sensing value is indicative of the closeness of the first human body to the physical button switch, wherein if the first sensing value is greater than a first threshold value, the sensing module determines that the first human body is closing to the physical button switch.

9. The device for preventing inadvertently touch of the electronic device of claim 8, wherein if the physical button switch is not triggered by the operating motion, the sensing module does not send the physical button switch signal corresponding to the physical button switch to the electronic device.

10. The device for preventing inadvertently touch of the electronic device of claim 8, wherein the sensing module comprises a sensing unit and logic unit, wherein the sensing unit generates a first enable signal, wherein the physical button switch generates a second enable signal, wherein the logic unit generates the physical button switch signal according to the first enable signal and the second enable signal, and sends the physical button switch signal to the electronic device.

11. The device for preventing inadvertently touch of the electronic device of claim 10, wherein the logic unit comprises an AND gate.

12. The device for preventing inadvertently touch of the electronic device of claim 8, wherein the electronic device comprises a touch screen, wherein the sensing module senses whether a second human body is entering a second range, and generates a second sensing value in response to that the second human body entering the second range is sensed, wherein the second range is another spatial range which at least covers a physical part of the electronic device, wherein the second sensing value is indicative of the closeness of the second human body to the physical part of the electronic device, wherein if the second sensing value is greater than a second threshold value, the sensing module sends a screen turn-off signal and/or a touch function disable signal to the electronic device to turn off a screen display of the touch screen and/or to disable a touch function.

13. The device for preventing inadvertently touch of the electronic device of claim 8, wherein the sensing module comprises a proximity sensor, and a proximity sensing antenna of the proximity sensor is disposed adjacent to the physical button switch.

14. The device for preventing inadvertently touch of the electronic device of claim 8, wherein the sensing module comprises a sensing material layer, and the sensing material layer is disposed on the physical surface of the physical button switch.

* * * * *